United States Patent
Ahmed et al.

(10) Patent No.: US 11,196,138 B1
(45) Date of Patent: Dec. 7, 2021

(54) CIRCULATOR WITH INTEGRATED DIRECTIONAL COUPLER, AND COMMUNICATION SYSTEMS INCLUDING THE SAME

(71) Applicant: NXP USA, Inc., Austin, TX (US)

(72) Inventors: Abdulrhman M. S. Ahmed, Gilbert, AZ (US); James Krehbiel, Chandler, AZ (US); Joseph Staudinger, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 17/039,027

(22) Filed: Sep. 30, 2020

(51) Int. Cl.
*H01P 1/38* (2006.01)
*H04B 1/44* (2006.01)
(Continued)

(52) U.S. Cl.
CPC ................ *H01P 1/38* (2013.01); *H01F 7/02* (2013.01); *H01P 11/00* (2013.01); *H03F 1/3241* (2013.01);
(Continued)

(58) Field of Classification Search
CPC .... H01P 1/38; H01P 1/387; H01P 7/02; H01P 7/065; H01P 7/10; H01P 11/00; H01P 11/003; H01P 11/007; H01B 1/04; H01B 1/0475; H01B 1/40; H01B 1/44; H01B 1/48; H01B 1/525; H01B 1/1036; H03F 1/32; H03F 1/3241; H03F 3/19; H03F 3/195
See application file for complete search history.

(56) References Cited

U.S. PATENT DOCUMENTS 7,855,617 B2 * 12/2010 Cheung .................. H01P 1/387
333/109
8,040,199 B2 * 10/2011 Carr ....................... H01P 1/387
333/1.1
(Continued)

FOREIGN PATENT DOCUMENTS

WO WO-2012/043909 A1 4/2012

OTHER PUBLICATIONS

Shim, Sunbo et al; "A CMOS Power Amplifier With Integrated-Passive-Device Spiral-Shaped Directional Coupler for Mobile UHF RFID Reader"; IEEE Transactions on Microwave Theory and Techniques, vol. 59, No. 11; 10 pages (Nov. 2011).

*Primary Examiner* — Quochien B Vuong
(74) *Attorney, Agent, or Firm* — Sherry W Gourlay

(57) ABSTRACT

A circulator-coupler device includes a ferrite element, a resonator over and aligned along an axis with the ferrite element, and a plurality of resonator ports connected to the resonator. The plurality of resonator ports includes first and second resonator ports, and a first portion of a perimeter of the resonator extends between the first and second resonator ports. The circulator further includes a coupler element positioned across a gap from the first portion of the perimeter of the resonator, and a coupler port connected to the coupler element. The device also may include a permanent magnet aligned along the axis with the ferrite element, where the permanent magnet biases the ferrite element and causes a signal conducted through the resonator to have a directionality along a rotational direction that extends from the first resonator port to the second resonator port.

22 Claims, 7 Drawing Sheets

(51) Int. Cl.
*H04B 1/04* (2006.01)
*H03F 1/32* (2006.01)
*H03F 3/19* (2006.01)
*H01F 7/02* (2006.01)
*H04B 1/48* (2006.01)
*H01P 11/00* (2006.01)

(52) U.S. Cl.
CPC ............ *H03F 3/19* (2013.01); *H04B 1/0475* (2013.01); *H04B 1/48* (2013.01); *H03F 2200/294* (2013.01); *H03F 2200/451* (2013.01); *H04B 2001/0425* (2013.01)

(56) References Cited

U.S. PATENT DOCUMENTS

| | | | |
|---:|---|---|---|
| 9,912,028 B2 * | 3/2018 | Dakhiya | H04B 1/40 |
| 10,554,245 B2 * | 2/2020 | Morrison | H04B 1/48 |
| 10,630,241 B2 | 4/2020 | Ahmed et al. | |
| 10,637,525 B2 * | 4/2020 | Nagano | H04B 1/48 |
| 10,847,857 B2 * | 11/2020 | Lynch | H01P 1/38 |
| 2018/0166763 A1 * | 6/2018 | Cruickshank | H01P 1/38 |

* cited by examiner

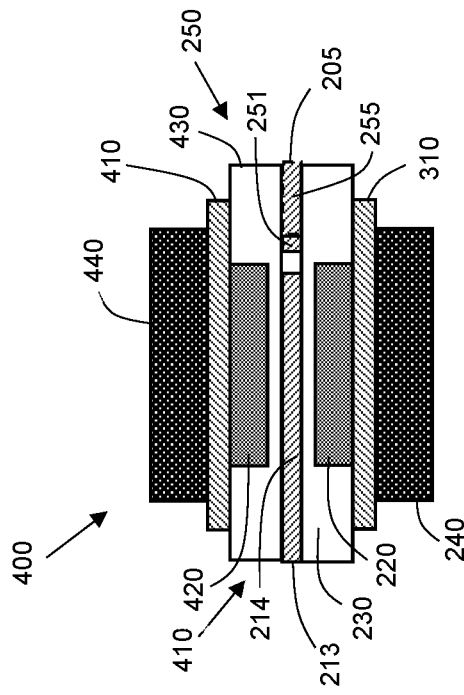
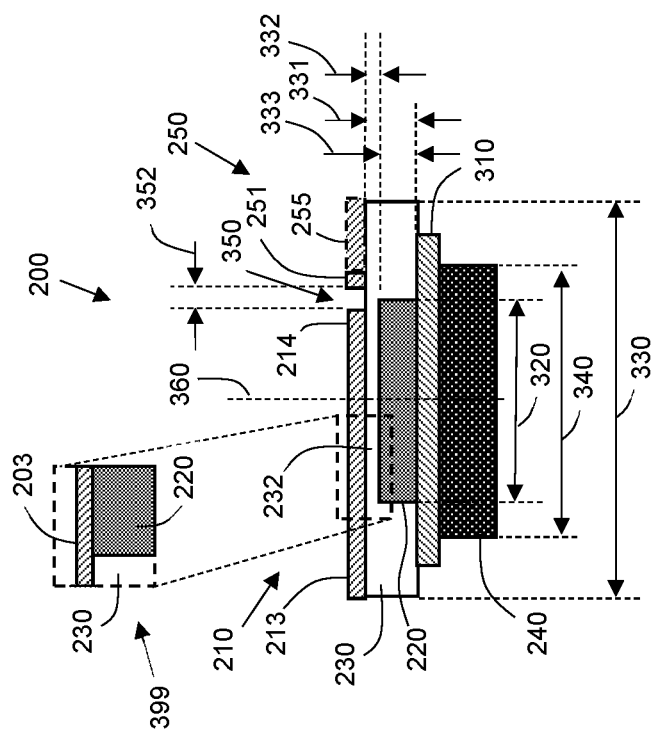
FIG. 3
FIG. 4

CIRCULATOR WITH INTEGRATED DIRECTIONAL COUPLER, AND COMMUNICATION SYSTEMS INCLUDING THE SAME

TECHNICAL FIELD

Embodiments of the subject matter described herein relate generally to radio frequency (RF) communication systems, and more particularly to RF transmitters that utilize circulators and output signal feedback for digital pre-distortion of input RF signals.

BACKGROUND

In typical wireless communication system, a transceiver includes a transmitter lineup and a receiver lineup, both of which are coupled to an antenna that is used both to transmit radio frequency (RF) signals over the air interface and to receive RF signals present on the air interface. A circulator between the antenna and the transmitter/receiver lineups is used to isolate the transmit and receive signals from each other, and to minimize load impedance variations to the transmitter's power amplifier due to antenna loading. Desirable features of a circulator include low insertion loss, high isolation, and a relatively small size.

In some systems, a directional coupler is placed near a transmission line (e.g., a quarter-wave output transformer) between the transmitter's power amplifier and the circulator. The function of the directional coupler is to provide RF feedback to enable digital predistortion and linearization of the transmit signals.

In systems that include a directional coupler and a circulator, there may be an undesirably high level of insertion loss associated with the quarter-wave output transformer, the directional coupler, and the circulator. As operational frequencies for wireless communication systems continue to increase, the detrimental impacts of insertion losses (and other losses) are becoming more acute. In order to achieve high efficiency, designers of wireless communication systems strive to reduce such losses in advanced transmitters and transceivers. In addition, system designers continually strive to reduce system cost and size.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 3 is a cross-sectional, side view of the microstrip junction circulator of FIG. 2 along line 3-3.

FIG. 4 is a cross-sectional, side view of a stripline junction circulator with an integrated directional coupler, in accordance with another example embodiment;

DETAILED DESCRIPTION

Embodiments of the inventive subject matter include circulator devices with integrated directional couplers (referred to herein as "circulator-coupler" devices), and transmitters/transceivers that include such circulator-coupler devices. According to various embodiments, a directional coupler is integrally formed in a circulator device in proximity to a resonator of the circulator, rather than in proximity to an external signal transmission line, as is done in a conventional system. The circulator-coupler device may be characterized by a lower overall insertion loss, in comparison with conventional solutions, along with enabling a smaller-sized implementation of a circulator and coupler in a transmitter lineup.

Figure 1:
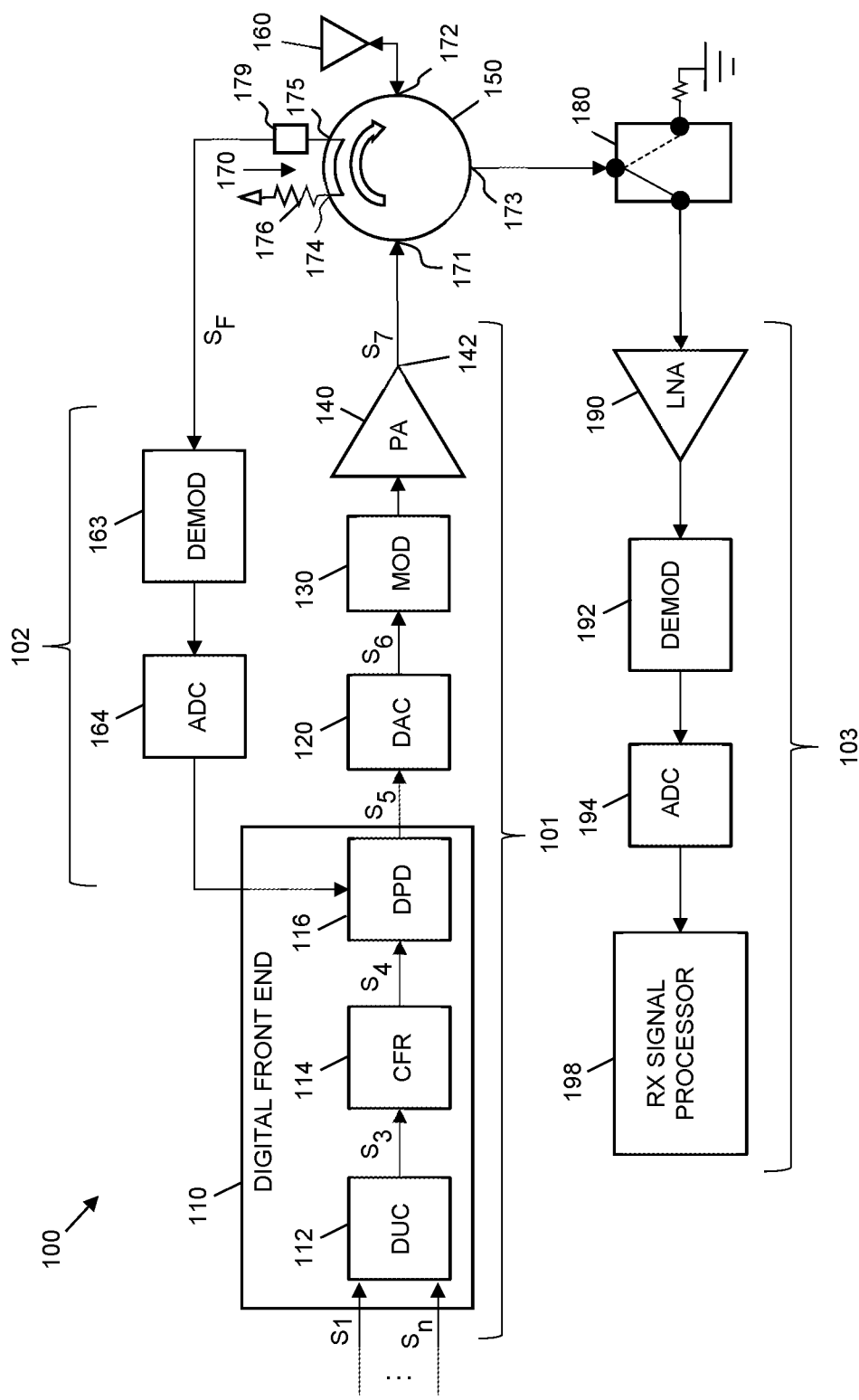
FIG. 1 is a simplified block diagram of an RF transceiver, in accordance with an example embodiment.

FIG. 1 is a simplified block diagram of a radio frequency (RF) transceiver 100 (or more generally, a "wireless communication system"), in accordance with an example embodiment. The transceiver 100 includes a transmitter lineup 101 with a feedback path 102, a receiver lineup 103, an embodiment of a circulator-coupler device 150, and an antenna 160. In addition, the transceiver 100 includes an optional RF switch 180, in an embodiment.

The transmitter lineup 101 includes a digital front end (DFE) 110, a digital-to-analog converter (DAC) 120, a modulator (MOD) 130, and a power amplifier (PA) 140. Generally, the DFE 110 processes digital baseband signals for various channels to pre-condition the digital signals for amplification and wireless transmission. According to an embodiment, the DFE 110 includes a digital up-converter (DUC) circuit 112, a crest factor reduction (CFR) circuit 114, and a digital pre-distortion (DPD) circuit 116. The DUC circuit 112 receives signals S1 to Sn (e.g., n=1 to 5) from a baseband processor (not illustrated), where each of signals S1 to Sn corresponds to a unique digital, baseband, information-bearing signal that is intended to be conveyed using a distinct carrier signal. For example, signals S1 to Sn may comprise time-domain, in-phase/quadrature (IQ) samples associated with a given communication technology. For example, signals S1 to Sn may correspond to LTE (Long Term Evolution) signals, respectfully associated with n LTE carriers, which are intended to be transmitted using the antenna 160 of an LTE base station. Although LTE may be one type of communication technology supported by the system, other communication technologies may be supported, as well.

DUC circuit 112 up-converts the input signals, S1 to Sn, to a higher sampling rate, and produces a common digital composite signal, S3. In conjunction with the up-conversion, DUC circuit 112 may perform channel filtering and cleaning operations on signals S1 to Sn in order to comply with spectral mask regulations (e.g., to avoid frequency leakage between the multiple carriers). Further, DUC circuit 112 may interpolate to a composite rate and may perform multi-carrier aggregation of the input signals, thereby creating the digital composite signal, S3, at a composite sampling rate.

The CFR circuit 114 performs peak-to-average power ratio reduction on the digital composite signal, S3, thereby creating a clipped digital composite signal, S4. The DPD circuit 116 then performs a digital pre-distortion process on the clipped digital composite signal, S4, so as to generate a digitally-predistorted signal, S5. The digital pre-distortion performed by DPD circuit 116 is intended to pre-compensate for signal distortion that will be applied to an RF version of the signal by the downstream PA 140 and other components.

The pre-distorted digital baseband signal, S5, is converted to an analog baseband signal, S6, by DAC 120, and then upconverted by a modulator 130 to RF frequencies before being supplied to the PA 140. The PA 140 amplifies the analog signal, S6, resulting in a high-power RF signal, S7, which is produced at the output 142 of the PA 140. The high-power RF signal, S7, is then supplied through the circulator-coupler device 150 to a system antenna 160, which radiates the signal over the air interface.

As will be described in detail below in conjunction with FIGS. 2-6, the circulator-coupler device 150 is a highly directional, multiple-port, discrete device. As used herein, a "port" of the circulator-coupler device 150 is an RF signal input or output to the circulator-coupler device 150. In circulator-coupler device 150, an RF signal entering at one of the ports is conveyed to the next port in rotation, but no significant RF signal energy is conveyed to any of the other ports, assuming that the circulator has a sufficiently high level of signal isolation, as is desired. In other words, the circulator-coupler device 150 is characterized by a signal-conduction directivity, which is indicated by the arrow within the depiction of circulator-coupler device 150. Essentially, RF signals may be conveyed between the circulator ports in a particular two-dimensional rotational direction (e.g., clockwise or counterclockwise), and not in the opposite rotational direction.

In the embodiment illustrated in FIG. 1, the circulator-coupler device 150 has a transmitter port 171, an antenna port 172, and a receiver port 173, and the circulator-coupler device 150 is biased to transmit RF signal energy in a clockwise direction, as indicated by the arrow. Accordingly, the circulator-coupler device 150 transmits the RF signal, S7, which is received at transmitter port 171, to the antenna port 172 in the clockwise direction, but does not transmit significant signal energy of the RF signal, S7, to the receiver port 173. Similarly, for an RF signal received by antenna 160 over the air interface, the circulator-coupler device 150 transmits the received RF signal from the antenna port 172 to the receiver port 173 in the clockwise direction, but does not transmit significant signal energy of the received RF signal to the transmitter port 171. Those of skill in the art would understand, based on the description herein, that the circulator-coupler device 150 alternatively may be biased to transmit signal energy in an opposite rotational direction (e.g., a counter-clockwise direction), in which case the transmitter lineup 101, the receiver lineup 103, and the antenna 160 would be coupled to different ports of the circulator-coupler device 150.

As indicated previously, the PA 140 may undesirably distort the RF signal during the amplification process, and the DPD circuit 116 is designed to pre-compensate for that distortion by pre-distorting the signal in the digital domain in an inverse manner. In order for the DPD circuit 116 to accurately pre-distort the digital signal, the DPD circuit 116 analyzes a downconverted and digitized version of a feedback signal, $S_F$, which is produced along the feedback path 102. In contrast to conventional transmitter lineups, and in accordance with various embodiments of the inventive subject matter, the feedback signal, $S_F$, is generated by a directional coupler 170 that is integrally formed with and internal to the circulator-coupler device 150, rather than being generated by an external directional coupler.

As will be described in detail below, the directional coupler 170 is integrated within the circulator-coupler device 150 in proximity to a resonator (e.g., resonator 214, FIG. 2) within the circulator-coupler device 150. More specifically, the directional coupler 170 includes a conductive element (e.g., conductive element 251, FIG. 2, referred to herein as the "coupler element") in proximity to and electromagnetically coupled with the circulator resonator. The coupler element has first and second ends that are coupled to two additional ports 174, 175 of the circulator-coupler device 150. A first one of these ports 174 (referred to herein as the "isolated port") is terminated to a ground reference voltage (referred to simply as "ground" herein) through a resistor 176 (e.g., a 50 ohm resistor, although the resistance could be lower or higher, as well). A second one of these ports 175 (referred to herein as the "coupled port") is coupled to the feedback path 102. According to an embodiment, the isolated port 174 is connected to the end of the internal coupler element (e.g., conductive element 251, FIG. 2) that is physically closer to the transmitter port 171, and the coupled port 175 is connected to the other end of the internal coupler element, which is physically closer to the antenna port 172. According to an embodiment, the coupled port 175 also may be connected to a termination tuning circuit 179. In various embodiments, all or a portion of the termination tuning circuit 179 may be implemented with circuitry that is external or internal to the circulator-coupler device 150. Whether implemented externally and/or internally, the termination tuning circuit 179 may function to improve the directivity of the directional coupler 170 by compensating for the reactance associated with termination resistor 176 at high frequencies. For example, the termination tuning circuit 179 may include one or more shunt circuits coupled between the coupled port 175 and ground (e.g., including a first shunt circuit with a series combination of an inductor and capacitor, and a second shunt circuit including a resistor).

A feedback signal, $S_F$, is produced by the integrated directional coupler 170 at the coupled port 175. The feedback signal, $S_F$, essentially is a reduced-power (lower-amplitude) version of the incident RF signal produced by the PA 140, and which travels through the circulator-coupler device 150 between the transmitter port 171 and the antenna port 172.

The feedback signal, $S_F$, is converted, along the feedback path 102, into a baseband signal by a demodulator 163, and the baseband feedback signal is then converted into a baseband digital feedback signal by ADC 164 before being supplied to the DPD circuit 116. As indicated above, the DPD circuit 116 utilizes the baseband digital feedback signal supplied by the ADC 164 to pre-distort the clipped digital composite signal, S4, so as to generate the digitally-predistorted signal, S5.

As mentioned above, antenna 160 is coupled to antenna port 172 of the circulator-coupler device 150, and for RF signals received by antenna 160 from the air interface, the circulator-coupler device 150 transmits the received RF signal from the antenna port 172 to the receiver port 173 in a clockwise direction. According to an embodiment, the receiver port 173 is coupled through an RF switch 180 to the receiver lineup 103. Essentially, the purpose of the RF switch 180 is to avoid conveying transmitter signal energy into the receiver lineup 103 while the transceiver 100 is in a transmit mode of operation. The RF switch 180 is a three-port device, with a first port coupled to the receiver port 173 of the circulator-coupler device 150, a second port coupled to the receiver lineup 103, and a third port coupled to a ground reference node through a resistor. When the transceiver 100 is in the transmit mode of operation, an RF switch controller (not illustrated) operates the RF switch 180 as a fail-safe switch by coupling the first port to a ground reference node (e.g., as indicated by the dashed line within RF switch 180). When the transceiver 100 is in a receive mode of operation, the RF switch 180 is controlled by the RF switch controller to be in a receive state, as shown in FIG. 1. In the receive state, the first port of the RF switch 180 is coupled to the second port, and thus the receiver port 173 of the circulator-coupler device 150 is coupled through RF switch 180 to the receiver lineup 103.

The receiver lineup 103 includes a receive amplifier 190 (e.g., a low noise amplifier (LNA)), a demodulator (DE-MOD) 192, an analog-to-digital converter (ADC) 194, and an RX signal processor 198. The receive amplifier 190 is configured to amplify relatively low power received signals received from the antenna 160 (through the circulator-coupler device 150 and the RF switch 180). The demodulator 192 downconverts the amplified received signal to a baseband frequency, and the downconverted signal is converted to a digital baseband signal by ADC 194. The receive signal processor 198 is configured to consume or process the digital baseband signal.

Although FIG. 1 illustrates a transceiver 100 with transmit and receiver lineups 101, 103, embodiments may be implemented also in a transmitter-only system, in which the receiver lineup 103 is excluded. In such an embodiment, the receiver port 173 may be coupled to ground (e.g., through a resistor), and the circulator-coupler device 150 may function as an isolator that is configured to convey RF transmit signals between ports 171 and 172.

Embodiments of circulator-coupler devices will now be described in conjunction with FIGS. 2-5. More specifically, FIGS. 2-5 depict various embodiments of circulator-coupler devices that include microstrip and stripline junction circulators with include integrated directional couplers.

Figure 2:
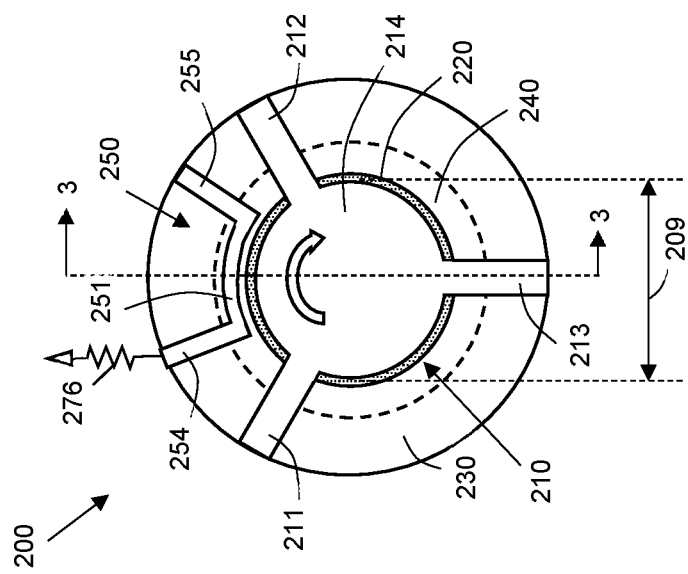
FIG. 2 is a top view of a microstrip junction circulator with an integrated directional coupler, in accordance with an embodiment.

Starting first with FIG. 2, a top view of a circulator-coupler device 200 that includes a microstrip junction circulator 210 (e.g., circulator 150, FIG. 1) and an integrated directional coupler 250 (e.g., directional coupler 170, FIG. 1) is shown, in accordance with an embodiment. For enhanced understanding, FIG. 2 should be viewed simultaneously with FIG. 3, which is a cross-sectional, side view of the circulator-coupler device 200 of FIG. 2 along line 3-3.

Circulator-coupler device 200 includes a microstrip junction circulator 210. Essentially, the microstrip junction circulator 210 includes a stacked arrangement of an electrically conductive resonator 214 coupled to a plurality of ports 211, 212, 213, a ferrite element 220 at least partially surrounded by a dielectric substrate 230, a ground plane 310, and a permanent magnet 240. The resonator 214, ferrite element 220, ground plane 310, and permanent magnet 240 are generally aligned along a vertical axis (e.g., axis 360, FIG. 3).

According to one embodiment, the ports 211-213 and the resonator 214 are integrally formed together as a stamped (or otherwise formed), thin, conductive structure. In such an embodiment, the distal ends of the ports 211-213 may coincide with the perimeter of the dielectric substrate 230, as shown in FIG. 2, or the distal ends of the ports 211-213 may extend to points beyond the perimeter of the dielectric substrate 230 in a cantilevered manner. According to another embodiment, the ports 211-213 and the resonator 214 are formed on the top surface of the dielectric substrate 230 using semiconductor fabrication techniques (e.g., sputtering, photolithography, and so on). The resonator 214 and ports 211-213 are formed from one or more layers of electrically conductive material (e.g., copper, aluminum, gold, or other suitable materials).

As seen in the top view of FIG. 2, the resonator 214 essentially is circular, and proximal ends of the ports 211-213 are connected to the perimeter of the resonator 214. According to an embodiment, a width 209 (or diameter) of the resonator 214 is in a range of about 5 millimeters (mm) to about 20 mm, and a thickness of the resonator 214 is in a range of about 0.2 mm to about 1.0 mm, although the width 209 and/or thickness may be smaller or larger, as well.

Each of the ports 211-213 extends from its proximal end perpendicularly outward from the perimeter of the resonator 214 to its distal end, which corresponds to a signal I/O point of the device 200. The three distal port ends may be electrically connected to three device terminals (not shown), which are configured for mechanical and electrical connection to an external substrate and external circuitry. According to an embodiment, the ports 211-213 are equally spaced (i.e., separated from one another by about 120 degrees) around the circular perimeter of the resonator 214. During operation of the circulator device 200, the ports 211-213 may function as input or output conductors. As an input conductor, a port 211-213 may convey an RF signal received from external circuitry from the distal port end to the proximal port end, and thus to the resonator 214. As an output conductor, a port 211-213 may convey an RF signal received from the resonator 214 from the proximal port end to the distal port end, and thus to external circuitry coupled to the device 200. Along with providing signal I/O functionality, each port 211-213 is characterized by a port impedance, and thus each port may inherently include an impedance transformer. For example, each port 211-213 may include or be configured as a quarter-wave transformer, in an embodiment. Further, although each port 211-213 may have the same port impedance in some embodiments, the port impedances of the ports 211-213 may be substantially different, in other embodiments (e.g., at least one of the port impedances may be at least 10 percent higher or lower than the other port impedance(s)). Varying the port impedances may help to account for the asymmetry of the device 200 due to the inclusion of the integrated directional coupler 250.

According to an embodiment, the dielectric substrate 230 functions as a support structure for the other components of the device 200, and is defined by a top surface, a bottom surface, and sidewalls extending between the top and bottom surfaces. The resonator 214 and the ports 211-213 are coupled to the top surface of the dielectric substrate 230, and the ground plane 310 is connected to the bottom surface of the dielectric substrate 230. The ferrite element 220 is at least partially embedded in the dielectric substrate 230, as will be described in more detail below.

The dielectric substrate 230 may be a homogenous structure formed from bulk dielectric material, in an embodiment, or the dielectric substrate 230 may be formed from a plurality of dielectric layers and/or materials, in other embodiments. For example, the dielectric substrate 230 may be formed from one or more dielectric materials including glass, ceramic, polytetrafluoroethylene (PTFE), FR-4 (woven glass and epoxy), and/or other suitable dielectric materials.

As shown in FIG. 2, the dielectric substrate 230 may have a circular cross-sectional shape, or the dielectric substrate 230 may have any of a variety of other cross-sectional shapes (e.g., rectangular, pentagonal, hexagonal, and so on). According to an embodiment, a width 330 (or diameter) of the dielectric substrate 230 is wider that the width 320 of the ferrite element 220 (e.g., 1.5 to 3.0 times wider), and may be in a range of about 10 mm to about 30 mm. A thickness 331 of the dielectric substrate 230 may be in a range of about 0.2 mm to about 4 mm, although the width 330 and height 331 may be smaller or larger, as well.

As mentioned above, the ferrite element 220 is at least partially embedded in the dielectric substrate 230, and is defined by a top surface, a bottom surface, and sidewalls extending between the top and bottom surfaces. As shown in FIG. 2, the ferrite element 220 may have a disc or puck shape, although the ferrite element 220 may have other suitable shapes, as well (e.g., triangular, hexagonal, and so on). As shown in FIG. 2, the ferrite element 220 may have a circular cross-sectional shape, or the ferrite element 220 may have any of a variety of other cross-sectional shapes (e.g., rectangular, pentagonal, hexagonal, and so on). According to an embodiment, a width 320 (or diameter) of the ferrite element 220 is at least as wide as the width 209 (or diameter) of the resonator 214 so that the ferrite element 220 may underlie an entirety of the resonator 214. For example, the width 320 of the ferrite element 220 may be equal to or larger than the width (or diameter) of the resonator, such as in a range of about 5 mm to about 20 mm or more, although the width 320 may be smaller or larger, as well. Further, the thickness 333 of the ferrite element 220 may be less than or substantially equal to the thickness 331 of the dielectric substrate 230, in various embodiments.

According to an embodiment, the ferrite element 220 is inserted into or embedded within the dielectric substrate 230. For example, the ferrite element 220 may be inserted into an opening the dielectric substrate 230, or the dielectric substrate 230 may be formed around the ferrite element 220. According to an embodiment, the bottom surface of the ferrite element 220 is co-planar with the bottom surface of the dielectric substrate 230, so that the ferrite element 220 may make physical contact with the ground plane 310, once the ground plane 310 is coupled to the bottom surface of the dielectric substrate 230.

In contrast, the top surface of the ferrite element 220 may either be below the top surface of the dielectric substrate 230 or may be substantially co-planar with the top surface of the dielectric substrate 230, in various embodiments. In the former embodiment, a portion 232 of the dielectric substrate 230 may be present between the top surface of the ferrite element 220 and the resonator 214. For example, the portion 232 of the dielectric substrate 230 between the ferrite element 220 and the resonator 214 may have a thickness 332 in a range of about 0.05 mm to about 1.0 mm, although the thickness 332 may be smaller or larger, as well. In such an embodiment, the dielectric substrate 230 may have an opening in its bottom surface, which does not extent all the way through the dielectric substrate 230, and the ferrite element 220 may be inserted into the opening in the bottom surface of the dielectric substrate 230. For example, the opening may have a depth that is substantially equal to the thickness 333 of the ferrite element 220. Further, in such an embodiment, the resonator 214 may be directly coupled to or formed on the portion of the top surface of the dielectric substrate 230 that overlies the ferrite element 220.

According to another embodiment, the dielectric substrate 230 may have a through hole that extends between its top and bottom surfaces (e.g., the dielectric substrate 230 may have a ring shape with a central opening). As is shown in the dashed box 399 above device 200, in such an embodiment, the top surface of the ferrite element 220 may be substantially co-planar with the top surface of the dielectric substrate 230, and the resonator 214 may be coupled to or formed on the top surface of the ferrite element 220. Alternatively, the top surface of the ferrite element 220 may be recessed below the top surface of the dielectric substrate 230, and an air gap (not shown) may be present between the top surface of the ferrite element 220 and the resonator 214. In still another alternate embodiment, the dielectric substrate 230 may be a planar dielectric structure that is sandwiched between the top surface of the ferrite element 220 and the resonator 214.

The ground plane 310 is directly coupled to an entirety of the bottom surface of the ferrite element 220 and may extend over all or portions of the bottom surface of the dielectric substrate 230. The ground plane 310 is configured to be electrically coupled to an external ground reference (e.g., a ground plane of a system in which the device 200 is included). According to various embodiments, the ground plane 310 may include a solid, electrically conductive structure, and/or one or more layers of conductive material (e.g., copper, aluminium, gold, or other suitable materials).

In order to appropriately bias the ferrite element 220, and thus to ensure proper operation of the microstrip junction circulator 210, a permanent magnet 240 is coupled to the ground plane below, and aligned with, the ferrite element 220. Biasing the ferrite element 220 with the permanent magnet 240 causes the signal conduction through the resonator 214 to have a directionality along a specific rotational direction (e.g., clockwise, as indicated in FIG. 2, although the permanent magnet 240 alternatively may be flipped to cause the signal conduction through the resonator 214 to have a directionality in a counter-clockwise direction). As shown in FIG. 2, the permanent magnet 240 may have a circular cross-sectional shape, or the permanent magnet 240 may have any of a variety of other cross-sectional shapes (e.g., rectangular, pentagonal, hexagonal, and so on). According to an embodiment, a width 340 (or diameter) of the permanent magnet 240 is equal to or greater than the width 320 of the ferrite element 220. For example, the width 340 of the permanent magnet 240 may be in a range of about 3 mm to about 10 mm, although the width 340 may be smaller or larger, as well.

As mentioned above, circulator-coupler device 200 also includes an integrated directional coupler 250 (e.g., directional coupler 170, FIG. 1), according to an embodiment. More specifically, the directional coupler 250 includes a conductive coupler element 251 that is electrically isolated from the resonator 214 across a gap 350 (e.g., an air gap), but is in close enough proximity to the resonator 214 as to be electromagnetically coupled. Accordingly, during operation, signal energy passing through the resonator 214 between ports 211 and 212 is electromagnetically coupled onto the coupler element 251. For example, the gap 350 may have a width 352 in a range of about 0.5 mil to about 20 mil, in an embodiment, or in a range of about 5 mil to about 10 mil, in another embodiment, although the gap 350 may be narrower or wider, as well.

The conductive element 251 and the resonator 214 are arranged to have a coupling factor between them in a range of about 10 decibels (dB) to about 40 dB, in an embodiment, or between about 20 dB and about 60 dB, in another embodiment, although the coupling factor may be lower or higher than these ranges, in other embodiments. Desirably, the conductive element 251 and the resonator 214 are arranged to have an insertion loss that is less than about 0.2 dB, in an embodiment, or less than about 0.1 dB, in another embodiment. In addition, the conductive element 251 and the resonator 214 have isolation of at least 10 dB greater than the coupling factor, in an embodiment. In other embodiments, the coupling factor, insertion loss, and/or isolation may be smaller or larger than the above-given values or ranges. According to an embodiment, the conductive element 251 has an electrical length in a range of about lambda/8 (i.e., about one eighth of the wavelength of a center frequency of operation of the amplifier) to about lambda/4 (i.e., about one fourth of the wavelength of the center frequency of operation of the amplifier) although the length may be shorter or longer, as well.

The coupler element 251 has first and second ends that are coupled to two additional ports 254, 255 (e.g., ports 174, 175, FIG. 1) of the circulator-coupler device 200. Between the first and second ends of the coupler element 251, the coupler element 251 may have a curved shape, which matches the contour of the perimeter of the resonator 214 so that the gap 350 is substantially uniform along an entirety of the coupler element 251. Each of the ports 254, 255 extends from a proximal end perpendicularly outward from a different end of the coupler element 251 to a distal end, which corresponds to a signal I/O point of the device 200. The two distal port ends may be electrically connected to two additional device terminals (not shown), which are configured for mechanical and electrical connection to an external substrate and external circuitry.

According to one embodiment, the coupler element 251 and the ports 254, 255 are integrally formed together as a stamped (or otherwise formed), thin, conductive structure. According to another embodiment, the coupler element 251 and the ports 254, 255 are formed on the top surface of the dielectric substrate 230 using semiconductor fabrication techniques (e.g., sputtering, photolithography, and so on). For example, the coupler element 251 and the ports 254, 255 may be formed simultaneously with forming the resonator 214 and ports 211-213. Either way, the the coupler element 251 and the ports 254, 255 are formed from one or more layers of electrically conductive material (e.g., copper, aluminum, gold, or other suitable materials). The coupler element 251 may be offset, in the vertical direction, from the ferrite element 220, as shown in FIG. 3. Alternatively, the coupler element 251 may overlie the ferrite element 220 in the vertical direction. Similarly, in various embodiments, the coupler element 251 may or may not overlie the permanent magnet 240 in the vertical direction.

As indicated previously, when the directional coupler 250 is intended to produce a feedback signal (at port 255) that is reflective of a forward RF signal traveling through the resonator 214 between ports 211 and 212, a first one of the coupler ports 254 (i.e., the "isolated port") is terminated to ground through a resistor 276 (e.g., resistor 176, such as a 50 ohm resistor, although the resistance could be lower or higher, as well). According to one embodiment, the resistor 276 may be an external discrete component, which may be coupled to the system substrate. In another embodiment, the resistor 276 may be implemented internally within the device 200. In such an embodiment, a first terminal of the resistor 276 may be coupled to port 254, and a second terminal of resistor 276 may be coupled to the ground plane 310 (e.g., with a conductive via that extends from port 254 through the dielectric substrate 230 to the ground plane 310). A second one of the coupler ports 255 (i.e., the "coupled port") is coupled to the feedback path (e.g., feedback path 102, FIG. 1) when the device 200 is integrated into the transmitter or transceiver system (e.g., system 100, FIG. 1).

According to an embodiment, the isolated port 254 is connected to the end of the coupler element 251 that is physically closer to port 211 (e.g., transmitter port 171, FIG. 1), and the coupled port 255 is connected to the other end of the coupler element 251, which is physically closer to port 212 (e.g., antenna port 172, FIG. 1). Given the directionality of device 200, a feedback signal (e.g., signal $S_F$, FIG. 1) that is reflective of the signal traveling through the resonator 214 between ports 211 and 212 is produced by the directional coupler 250 at the coupled port 212.

The above-described and illustrated components of the circulator-coupler device 200 may be housed in a housing (not illustrated) that configures the device 200 as a surface-mount device. The housing may include, for example, a structure that contains the device components in a fixed relationship to each other, along with pins and/or leads (not illustrated) that are electrically coupled to the various ports 211-213, 254, 255, and that are configured to be mechanically and electrically coupled to corresponding conductive traces or other elements on a system substrate (e.g., PCB 710, FIG. 7) to which the circulator-coupler device 200 is connected.

The combination of the resonator 214 over the single ground plane 310 characterizes device 200 as a microstrip junction circulator. In an alternate embodiment, the resonator 214 may be sandwiched between two ground planes in order to produce a stripline junction circulator.

For example, FIG. 4 is a cross-sectional, side view of a circulator-coupler device 400 that includes a stripline junction circulator 410 (e.g., circulator 150, FIG. 1) and an integrated directional coupler 250 (e.g., directional coupler 170, FIG. 1), in accordance with another example embodiment. Device 400 has several components that may be substantially similar to the components of device 200 (FIGS. 2, 3), and to the extent that a component is substantially similar, the same reference number is used in FIG. 4, and the various details and embodiments discussed above with respect to such a component applies also to the components in device 400. More particularly, circulator-coupler device 400 includes a stacked arrangement of an electrically conductive resonator 214 coupled to a plurality of ports (e.g., ports 211, 212, 213, FIG. 2), a first ferrite element 220 at least partially surrounded by a first dielectric substrate 230, a first ground plane 310, a first permanent magnet 240, and an integrated directional coupler 250 in electromagnetic proximity to the resonator 214.

In addition, device 400 includes a second ferrite element 420 at least partially surrounded by a second dielectric substrate 430, a second ground plane 410, and a second permanent magnet 440 in a stacked arrangement with the resonator 214, first ferrite element 220, first ground plane 310, and first permanent magnet 240. The combination of the second ferrite element 420 and the second dielectric substrate 430 may be substantially the same as the combination of the first ferrite element 220 and the first dielectric substrate 230, except in a flipped orientation. More specifically, the second dielectric substrate 430 may have an opening that extends partially or fully through the second dielectric substrate 430, and the second ferrite element 420 may be inserted into or embedded in the opening in the second dielectric substrate 430. In an embodiment in which the opening extends only partially through the second dielectric substrate 430, a portion of the second dielectric substrate 430 may be present between the bottom surface of the second ferrite element 420 and the resonator 214. Conversely, in an embodiment in which the opening extends all the way through the second dielectric substrate 430, the bottom surface of the second ferrite element 420 may physically contact the resonator 214, or an air gap may be present between the bottom surface of the second ferrite element 420 and the resonator 214. In still another alternate embodiment, the second dielectric substrate 430 may be a planar dielectric structure that is sandwiched between the bottom surface of the second ferrite element 420 and the resonator 214. Either way, the top surface of the second ferrite element 420 may be co-planar with the top surface of the second dielectric substrate 430, in an embodiment, and the second ground plane 410 is in direct contact with the top surface of the second ferrite element 420. In various embodiments, the first and second ferrite elements 220, 420 may be formed from the same or different ferrite materials.

The second permanent magnet 440 is coupled to the second ground plane 410. As shown in FIG. 4, the resonator 214, the first and second ferrite elements 220, 420, the first and second ground planes 310, 410, and the first and second permanent magnets 240, 440 are generally aligned along a vertical axis.

Referring again to FIG. 2, and as mentioned previously, the integration of the directional coupler 250 in device 200 in proximity to the resonator 214 renders the device 200 asymmetrical. In some embodiments, the effects of the asymmetry may be compensated for by configuring the ports 211, 212, 213 to have different port impedances. For example, the widths and/or lengths of the ports 211-213 may be different to achieve different port impedances. Alternatively, rather than spacing the ports 211-213 evenly around the perimeter of the resonator 214 (e.g., spacing the ports 211-213 about 120 degrees apart), the ports 211-213 may be spaced unevenly around the perimeter of the resonator 214 to compensate for the asymmetry of device 200.

Figure 5:
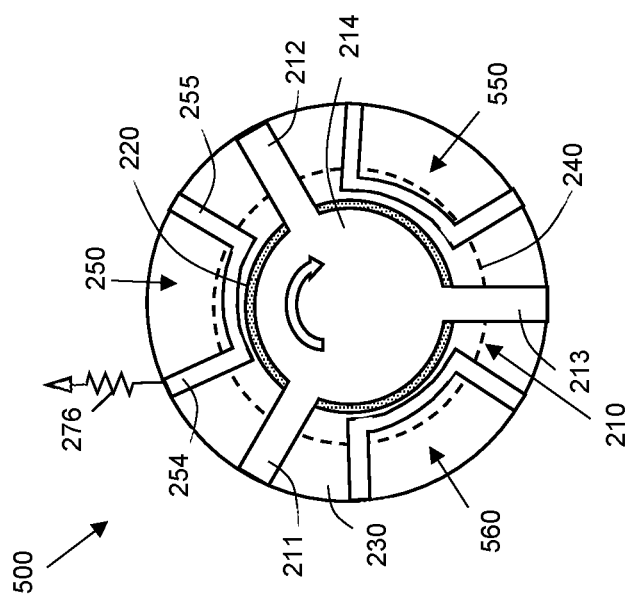
FIG. 5 is a top view of a symmetrical microstrip or stripline junction circulator with an integrated directional coupler, in accordance with yet another embodiment.

According to another embodiment, additional active or "dummy" coupler structures may be included between the other sets of ports to render the device symmetrical. For example, FIG. 5 is a top view of a symmetrical circulator-coupler device 500, in accordance with an example embodiment. Device 500 has several components that may be substantially similar to the components of devices 200 and 400 (FIGS. 2-4), and to the extent that a component is substantially similar, the same reference number is used in FIG. 5, and the various details and embodiments discussed above with respect to such a component applies also to the components in device 500. More particularly, circulator-coupler device 500 includes a stacked arrangement of an electrically conductive resonator 214 coupled to a plurality of ports 211, 212, 213, a first ferrite element 220 at least partially surrounded by a first dielectric substrate 230, a first ground plane (e.g., ground plane 310, FIG. 3), a first permanent magnet 240, and an integrated directional coupler 250 in electromagnetic proximity to the resonator 214. In addition, device 500 may include a second ferrite element (e.g., element 420, FIG. 4) at least partially surrounded by a second dielectric substrate (e.g., substrate 430, FIG. 4), a second ground plane (e.g., ground plane 410, FIG. 4), and a second permanent magnet (e.g., magnet 440, FIG. 4).

To render device 500 symmetrical, device 500 also includes a second "dummy" directional coupler 550 coupled to the dielectric substrate 230 in proximity to the resonator 214 between ports 212 and 213, and a third "dummy" directional coupler 560 coupled to the dielectric substrate 230 in proximity to the resonator 214 between ports 213 and 211. Each of the second and third directional couplers 550, 560 may have substantially the same construction, materials, and configuration as directional coupler 250, and may similarly be electrically isolated from the resonator 214 across a gap. In various embodiments, the ports of directional couplers 550, 560 may be electrically floating, or the ports may be terminated to ground (e.g., through external or integrated resistors (not illustrated)). In still other embodiments, a first port of directional coupler 550 and/or 560 may be terminated to ground, while a second port of directional coupler 550, 560 may be electrically coupled to external circuitry, in order to provide a feedback signal associated with signals traveling through the resonator 214 between ports 212 and 213, and/or between ports 213 and 211.

Referring again briefly to FIG. 1, embodiments of circulator-coupler device 150 may be coupled to the outputs of a variety of different types of power amplifiers (e.g., PA 140), in order to provide feedback for pre-distortion operations. In modern wireless communication systems, it may be particularly advantageous to couple an embodiment of circulator-coupler device 150 to the output of a Doherty power amplifier.

Figure 6:
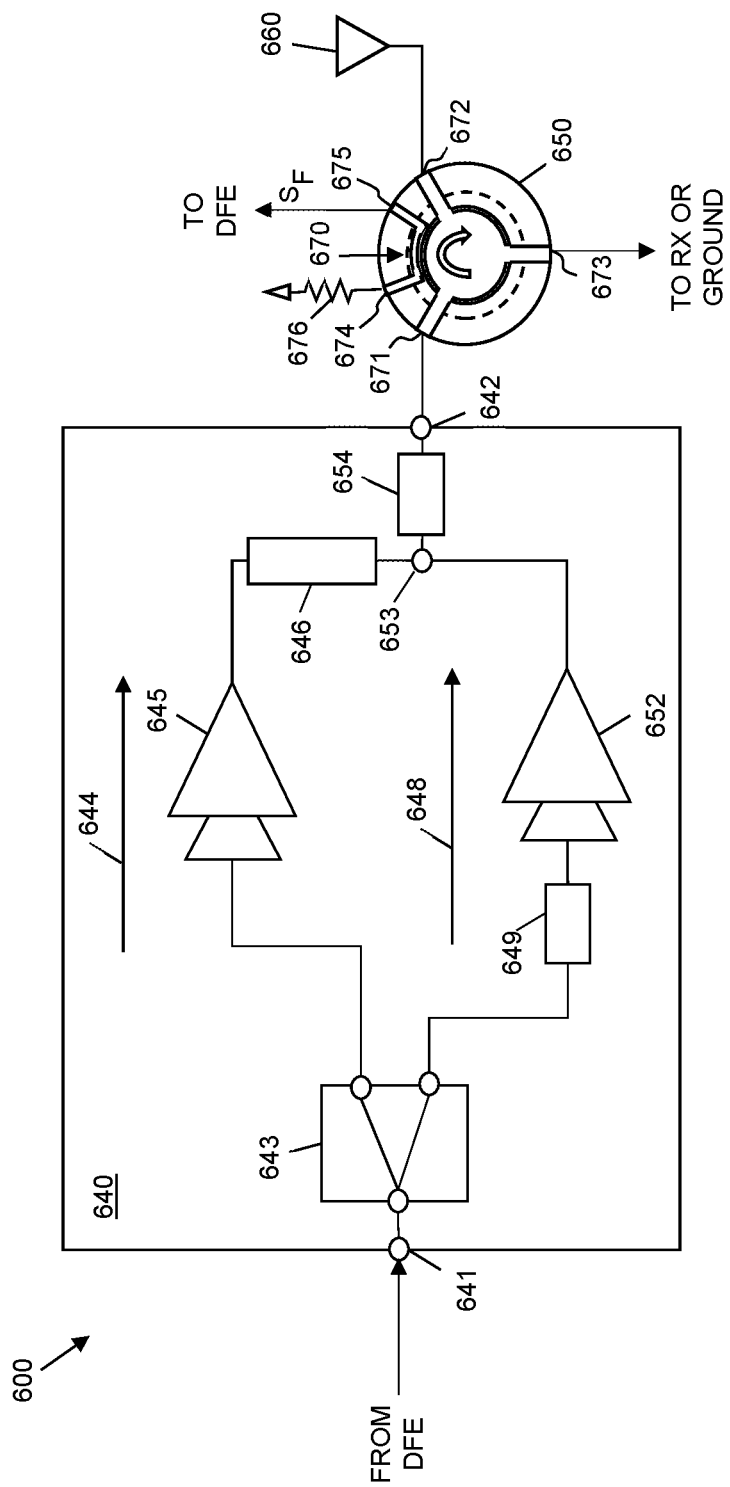
FIG. 6 is a schematic diagram of a transmitter lineup with a Doherty amplifier and a microstrip or stripline junction circulator with an integrated directional coupler, in accordance with an example embodiment.

For example, FIG. 6 is a schematic diagram of a portion of a transmitter lineup 600 that includes a circulator-coupler device 650 (e.g., device 150, 200, 400, 500, FIGS. 1-5) coupled to the output of a Doherty amplifier 640 (e.g., PA 140, FIG. 1), in accordance with an example embodiment. As will be explained below, the circulator-coupler device 650 includes an integrated directional coupler 670 configured to generate a feedback signal (e.g., feedback signal, $S_F$, FIG. 1) based on a forward signal traveling through the circulator-coupler device 650, in accordance with an example embodiment.

Figure 7:
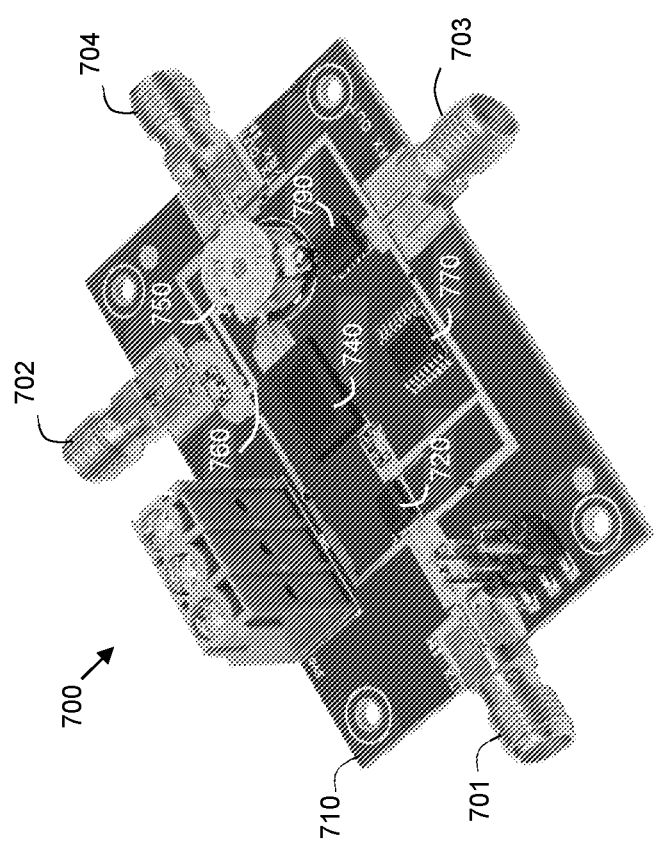
FIG. 7 is a perspective view of a transceiver module, in accordance with an example embodiment.

Some or all components of Doherty amplifier 640 may be implemented in a single device package or module (e.g., device/module 740, FIG. 7). Doherty amplifier 640 includes an RF input node 641, an RF output node 642, a power splitter 643, a carrier amplifier path 644, a peaking amplifier path 648, a combining node 653, and an output transformer 654, in an embodiment. When incorporated into a larger RF system, the RF input node 641 is coupled to an RF signal source (not illustrated, but such as DFE 110, DAC 120, and modulator 130, FIG. 1), and the RF output node 642 is coupled to an antenna 660 (e.g., antenna 160, FIG. 1) or to another type of load through circulator-coupler device 650. The RF signal source provides an input RF signal, which is an analog signal that includes spectral energy that typically is centered around one or more carrier frequencies. Fundamentally, the Doherty amplifier 640 is configured to amplify the input RF signal, and to produce an amplified RF signal at the RF output node 642.

The illustrated Doherty amplifier 640 is a 2-way Doherty amplifier (i.e., a Doherty amplifier with a carrier path and one peaking path), and thus the power splitter 643 has an input and two outputs, in an embodiment. In an alternate embodiment, the Doherty amplifier 640 may be an n-way Doherty amplifier (i.e., a Doherty amplifier with a carrier path and n−1 peaking paths, where n may be 3 or more), in which case the power splitter 643 would have n−1 outputs. Either way, the power splitter input is coupled to the RF input node 641 to receive the input RF signal. The power splitter 643 is configured to divide the RF input signal received at the input into first and second RF signals (or carrier and peaking signals), which are provided to the carrier and peaking amplifier paths 644, 648 through the power splitter outputs.

When Doherty amplifier 640 has a symmetrical configuration (i.e., a configuration in which the carrier and peaking amplifier power transistors are substantially identical in size), the power splitter 643 may divide or split the input RF signal received at the input into two signals that are very similar with, in some embodiments, equal power. Conversely, when Doherty amplifier 640 has an asymmetrical configuration (i.e., a configuration in which one of the amplifier power transistors, typically the peaking amplifier transistor, is significantly larger), the power splitter 643 may output signals having unequal power.

The outputs of the power splitter 643 are connected to the carrier and peaking amplifier paths 644, 648, respectively. The carrier amplifier path 644 is configured to amplify the carrier signal from the power splitter 643, and to provide the amplified carrier signal to the power combining node 653. Similarly, the peaking amplifier path 648 is configured to amplify the peaking signal from the power splitter 643, and to provide the amplified peaking signal to the power combining node 653, where the paths 644, 648 are designed so that the amplified carrier and peaking signals arrive substantially in phase with each other at the power combining node 653.

According to an embodiment, the carrier amplifier path 644 includes an input impedance matching circuit (not illustrated), a single-stage or multiple-stage carrier amplifier 645, and an impedance inverter 646 coupled in series between the first output of the power splitter 643 and the combining node 653. Each amplification stage of the carrier amplifier 645 includes a power transistor. More specifically, each power transistor may be a field effect transistor (FET), which includes a control terminal (e.g., a gate terminal) and first and second current-carrying terminals (e.g., a drain terminal and a source terminal). The carrier amplification path 644 also may include additional impedance matching circuits and gate and drain bias circuits, as well.

The output terminal of the carrier amplifier 645 is coupled to the power combining node 653 through the impedance inverter 646. According to an embodiment, the impedance inverter 646 is a lambda/4 ($\lambda$/4) phase shift circuit (e.g., a quarter wave transformer), which imparts about a 90-degree relative phase shift to the carrier signal after amplification by the carrier amplifier 645.

Reference is now made to the peaking amplifier path 648, which includes a phase shifter 649, an input impedance matching circuit (not illustrated), and a single-stage or multiple-stage peaking amplifier 652 coupled in series between the second output of the power splitter 643 and the combining node 653. The phase shifter 649 is a lambda/4 ($\lambda$/4) phase shift circuit (e.g., a quarter wave transformer), which imparts about a 90 degree phase shift to the peaking signal before amplification by the peaking amplifier 652, in order to compensate for the 90 degree phase shift imparted by the impedance inverter 646 along the carrier amplifier path 644 (i.e., to ensure that the amplified carrier and peaking signals arrive substantially in-phase at the combining node 653). Each amplification stage of the peaking amplifier 652 includes a power transistor (e.g., a FET). The peaking amplification path 648 also may include additional impedance matching circuits and gate and drain bias circuits, as well.

In a non-inverted Doherty amplifier, which is illustrated in FIG. 6, phase shifter 649 causes the peaking signal provided to the input of the peaking amplifier 652 to lag the phase of the carrier signal provided to the input of the carrier amplifier 645 by about 90 degrees. Conversely, in an inverted Doherty amplifier, the phase shift(s) are applied so that the phase of the carrier signal provided to the input of the carrier amplifier 645 lags the phase of the peaking signal provided to the input of the peaking amplifier 652 by about 90 degrees. Accordingly, in an alternate embodiment of an inverted Doherty amplifier, phase shifter 649 would be implemented along the carrier amplifier path 644 between the power splitter 643 and the input to the carrier amplifier 645 (rather than along the peaking amplifier path 648), and impedance inverter 646 would instead be implemented along the peaking amplifier path 648 between the output of the peaking amplifier 652 and the combining node 653 (rather than along the carrier amplifier path 644).

Amplifier 640 is configured so that the carrier amplifier path 644 provides amplification for relatively low level input signals, and both amplification paths 644, 648 operate in combination to provide amplification for relatively high level input signals. This may be accomplished, for example, by biasing the carrier amplifier transistor(s) so that the carrier amplifier 645 operates in a class AB mode, and biasing the peaking amplifier transistor(s) so that the peaking amplifier 652 operates in a class C mode.

The combining node 653 is electrically coupled to the RF output node 642 through output transformer 654, which may include an output microstrip transmission line and additional components (not illustrated in FIG. 6) to provide output impedance matching between the combining node 653 and the RF output node 642. The output transformer 654 functions to present proper load impedances to each of the carrier and peaking amplifiers 645, 652. The resulting amplified RF output signal is produced at RF output node 642.

The RF output node 642 is coupled to antenna 660 through circulator-coupler device 650 (e.g., device 150, 200, 400, 500, FIGS. 1-5). As described previously in conjunction with FIGS. 1-5, circulator-coupler device 650 includes a microstrip or stripline junction circulator with a plurality of ports 671, 672, 673 (e.g., ports 171-173, 211-213, FIGS. 1-5) that are coupled to a resonator (e.g., resonator 214, FIGS. 2-5). In the embodiment illustrated in FIG. 6, port 671 is a transmitter port (e.g. port 171, 211, FIGS. 1, 2, 5), which is coupled to the RF output node 642, port 672 is an antenna port (e.g., port 172, 212, FIGS. 1, 2, 5), which is coupled to antenna 660, and port 673 may be a receiver port (e.g., port 173, 213, FIGS. 1, 2, 5), which is coupled to a receiver lineup (e.g., receiver lineup 103, FIG. 1). Alternatively, port 673 may be terminated (e.g., with a 50 ohm resistor, although the resistance could be lower or higher, as well), in which case the circulator-coupler device 650 functions as an isolator device.

Circulator-coupler device 650 also includes an integrated directional coupler 670 (e.g., directional coupler 170, 250, FIGS. 1-5). As described in detail previously, the integrated directional coupler 670 includes a conductive element (e.g., conductive element 251, FIGS. 2-5) in proximity to and electromagnetically coupled with the circulator resonator. The coupler element has first and second ends that are coupled to two additional ports 674, 675 (e.g. ports 174, 175, FIGS. 1, 2, 5) of the circulator-coupler device 150. A first one of these ports 674 (i.e., the "isolated port") is terminated to ground through a resistor 676 (e.g., resistor 176, FIG. 1). A second one of these ports 675 (i.e., the "coupled port") is coupled to a feedback path (e.g., feedback path 102, FIG. 1). According to an embodiment, the isolated port 674 is connected to the end of the internal coupler element (e.g., conductive element 251, FIG. 2) that is physically closer to the transmitter port 671, and the coupled port 675 is connected to the other end of the internal coupler element, which is physically closer to the antenna port 672. A feedback signal, $S_F$, is produced by the integrated directional coupler 670 at the coupled port 675. The feedback signal, $S_F$, essentially is a reduced-power (lower-amplitude) version of the incident RF signal produced by the Doherty amplifier 640, and which travels through the circulator-coupler device 650 between the transmitter port 671 and the antenna port 672. According to a further embodiment, the circulator-coupler device 650 also may include one or more additional directional couplers (e.g., couplers 550, 560, FIG. 5) to render the device 650 symmetrical. The additional directional coupler(s) may be "dummy" couplers that are not connected to active circuitry, or the additional directional coupler(s) may have their ports connected to active circuitry in order to provide feedback that reflects the signals traveling between ports 672 and 673 and/or ports 673 and 671.

The transceiver and/or transmitter systems described in conjunction with FIGS. 1 and 6 may be implemented in various ways. For example, FIG. 7 is a perspective view of a module 700 that embodies portions of the RF transceiver 100 of FIG. 1, in accordance with an embodiment. More specifically, FIG. 7 illustrates that portions of the transceiver may be configured as a printed circuit board (PCB) module. The components of module 700 are mounted on (or coupled to) a system substrate 710, which may be, for example, a multi-layer PCB or other type of substrate. More specifically, module 700 includes a plurality of ICs and devices coupled to the system substrate 710, including a pre-amplifier device 710, a transmit amplifier module 740 (e.g., a module that embodies PA 140 or Doherty amplifier 640, FIGS. 1, 6), an RF switch controller IC 770, an RF switch and receive amplifier module 790 (e.g., a module that embodies RF switch 180 and receive amplifier 190, FIG. 1), and a circulator-coupler device 750 (e.g., circulator-coupler device 150, 200, 400, 500, 650, FIGS. 1-6). In addition, device 700 includes a transmit signal input connector 701 (e.g., corresponding to the input to amplifier 140, 640, FIGS. 1, 6), a feedback signal connector 702 (e.g., corresponding to a connection to feedback path 102, FIG. 1), a receive signal output connector 703 (e.g., corresponding to the output of amplifier 190, FIG. 1), and an antenna connector 704 (e.g., corresponding to an input to antenna 160, 660, FIGS. 1, 6). As discussed in detail above, the circulator-coupler device 750 includes a microstrip or stripline junction circulator (e.g., circulator 210, 410, FIGS. 2, 4) and an integrated/internal directional coupler (e.g., directional coupler 170, 250, 670, FIGS. 1-6). The various modules, devices, and connectors are electrically connected together through a plurality of conductive traces on and within the system substrate 710. As a specific example, the coupled port (e.g., port 175, 255, 675, FIGS. 1-6) may be electrically connected to the feedback signal connector 702 through trace 760.

After incorporation of module 700 into a transceiver system (e.g., system 100, FIG. 1), and during operation of the transceiver system, power and ground reference voltages may be provided to module 700 through power and ground terminals (not numbered). RF switch controller IC 770 may receive transmit/receive mode control signals through a control signal terminal (not numbered). Based on the received mode control signals, the RF switch controller IC 770 causes the RF switch (e.g., RF switch 180, FIG. 1) within the RF switch and receive amplifier module 790 to be in a transmit mode of operation or a receive mode of operation. When the RF switch is in the transmit mode of operation, the RF switch is configured to convey an RF signal from the circulator-coupler device 750 to ground. In addition, in the transmit mode, the amplified RF signal produced by the transmit amplifier module 740 is conveyed through the circulator-coupler device 750 to the antenna connector 704, and the feedback signal generated by the internal directional coupler within device 750 is conveyed to the feedback path through feedback signal connector 702.

When the RF switch is in the receive mode of operation, the circulator-coupler device 750 conveys an RF signal received from the antenna connector 704 to the receive amplifier module 790, and the RF switch within module 790 is configured to convey the received RF signal from the circulator-coupler device 750 to the receive amplifier (e.g., amplifier 190, FIG. 1) within module 790.

Figure 8:
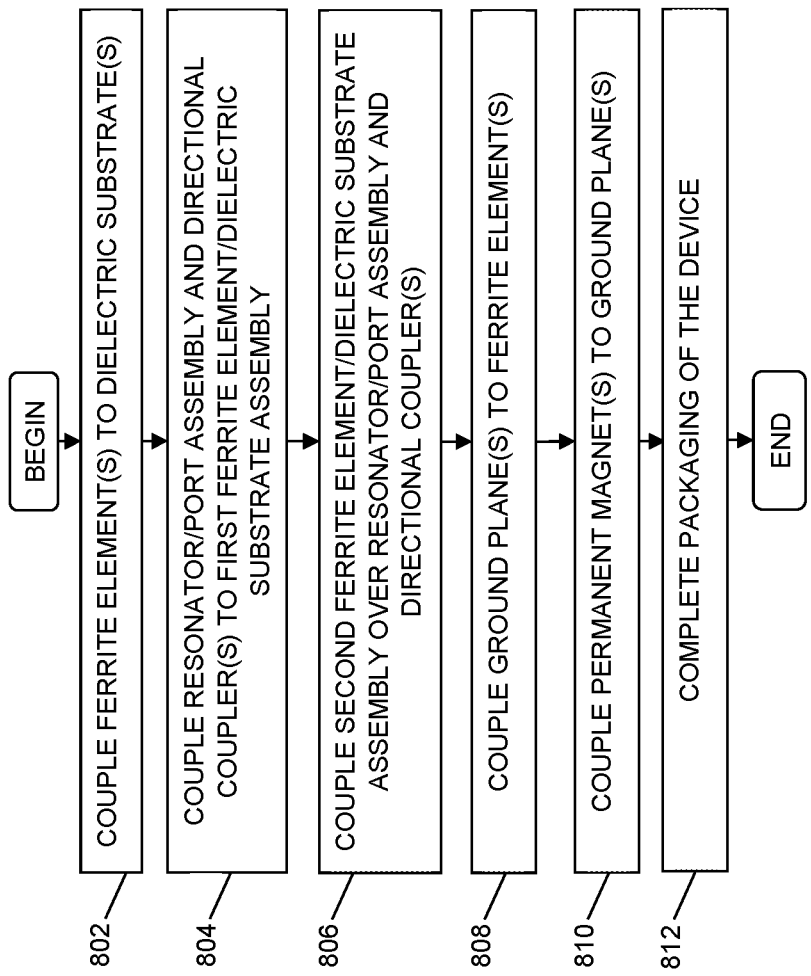
FIG. 8 is a flowchart of a method for fabricating a microstrip or stripline junction circulator with an integrated directional coupler, in accordance with an example embodiment.

FIG. 8 is a flowchart of a method for fabricating a microstrip or stripline junction circulator with an integrated directional coupler, in accordance with an example embodiment. In block 802, a first ferrite element (e.g., ferrite element 220, FIGS. 2-5) is coupled to a first dielectric substrate (e.g., substrate 230, FIGS. 2-5) to produce a first ferrite element/dielectric substrate assembly. When the device includes a stripline junction circulator, a second ferrite element (e.g., ferrite element 420, FIG. 4) is coupled to a second dielectric substrate (e.g., substrate 430, FIG. 4) to produce a second ferrite element/dielectric substrate assembly. For example, to create each assembly, the ferrite element may be inserted into an opening or through-hole in the dielectric substrate, in various embodiments, and as described previously.

In block 804, a first conductive assembly comprising a resonator (e.g., resonator 214, FIGS. 2-5) and a plurality of circulator ports (e.g., ports 211-213, FIGS. 2-5) is coupled to the first ferrite element/dielectric substrate assembly so that the resonator is aligned, along a vertical axis, with the first ferrite element. A portion of the first dielectric substrate may be present between the first ferrite element and the resonator, or alternatively, the first ferrite element may directly contact the resonator, or an air gap may be present between the first ferrite element and the resonator.

In addition, a second conductive structure comprising a coupler element (e.g., element 251, FIG. 2) and two coupler ports (e.g., ports 254, 255, FIG. 2) is coupled or otherwise secured to the top surface of the dielectric substrate, with a suitably sized gap (e.g., gap 350, FIG. 3) between the coupler element and the resonator. In some embodiments, additional "dummy" conductive structures (or additional coupler elements) (e.g., structures 550, 560, FIG. 5) also may be coupled to the top surface of the dielectric substrate to render the device symmetrical. In various embodiments, and as described previously, the first and second conductive assemblies (and the additional dummy conductive structures or coupler elements, when included) may be stamped (or otherwise formed), thin, conductive structures, or the first and second conductive assemblies (and the additional dummy conductive structures or coupler elements, when included) may be formed on the top surface of the first dielectric substrate using semiconductor fabrication techniques (e.g., sputtering, photolithography, and so on).

When the device includes a microstrip junction circulator, the method jumps to block 808, described later. Conversely, when the device includes a stripline junction circulator, then in block 806, the second ferrite element/dielectric substrate assembly is coupled to the top side of the resonator so that the resonator is aligned, along a vertical axis, with the second ferrite element in the second ferrite element/dielectric substrate assembly. A portion of the second dielectric substrate may be present between the second ferrite element and the resonator, or alternatively, the second ferrite element may directly contact the resonator, or an air gap may be present between the second ferrite element and the resonator.

In block 808, one or more ground planes (e.g., ground planes 310, 410, FIGS. 3, 4) are coupled to the surface(s) of the ferrite element(s) that face away from the resonator. According to an embodiment, the ground plane(s) may be formed from one or more layers of conductive materials. Then, in block 810, one or more permanent magnets (e.g., permanent magnets 240, 440, FIGS. 2-5) are coupled to the ground plane(s) in vertical alignment with the ferrite element(s) and the resonator.

Finally, packaging of the device is completed, in block 812. This may include, for example, covering the assembly in a housing that configures the device as a surface-mount device. The housing may include, for example, a structure that contains the device components in a fixed relationship to each other, along with pins and/or leads (not illustrated) that are electrically coupled to the various device ports, and that are configured to be mechanically and electrically coupled to corresponding conductive traces or other elements on a system substrate (e.g., PCB 710, FIG. 7) to which the circulator-coupler device ultimately may be connected. In some embodiments, clamps and/or screws may be utilized to hold the device components in a fixed relationship to each other. In other embodiments, the assembly may be overmolded with a non-conductive (e.g., plastic) encapsulant to contain the device components in a fixed relationship to each other. Upon completing the packaging process, the method may then end.

An embodiment of a circulator includes a first ferrite element, a resonator over and aligned along an axis with the first ferrite element, and a plurality of resonator ports connected to the resonator. The plurality of resonator ports includes a first resonator port and a second resonator port, and a first portion of a perimeter of the resonator extends between the first and second resonator ports. The circulator further includes a first coupler element positioned across a first gap from the first portion of the perimeter of the resonator, and a first coupler port connected to the first coupler element.

According to a further embodiment, the first coupler element and the resonator are arranged to have a coupling factor between them in a range of 10 decibels (dB) to 60 dB. According to another further embodiment, the circulator further includes a first dielectric substrate, and the first coupler element is coupled to the first dielectric substrate. According to yet another further embodiment, a portion of the first dielectric substrate is present between the first ferrite element and the resonator. According to yet another further embodiment, the resonator and the first coupler element are formed on the first dielectric substrate. According to yet another further embodiment, the resonator is in direct contact with the first ferrite element. According to yet another further embodiment, an air gap is present between the first ferrite element and the resonator. According to yet another further embodiment, the perimeter of the resonator is circular, and the first and second resonator ports are separated by 120 degrees around the perimeter of the resonator. According to yet another further embodiment, the plurality of resonator ports further includes a third resonator port. According to yet another further embodiment, the circulator further includes a second coupler element positioned across a second gap from a portion of the perimeter of the resonator that extends between the second and third resonator ports, and a third coupler element positioned across a third gap from a portion of the perimeter of the resonator that extends between the third and first resonator ports. According to yet another further embodiment, the circulator further includes a first permanent magnet aligned along the axis with the first ferrite element, where the first permanent magnet biases the first ferrite element and causes a signal conducted through the resonator to have a directionality along a rotational direction that extends from the first resonator port to the second resonator port. According to yet another further embodiment, the first coupler port is connected to a first end of the first coupler element, and the circulator further includes a second coupler port connected to a second end of the first coupler element. According to yet another further embodiment, the first coupler port is physically closer to the second resonator port, and the second coupler port is physically closer to the first resonator port. According to yet another further embodiment, the circulator further includes a resistor with a first terminal electrically coupled to the second coupler port, and a second terminal coupled to ground. According to yet another further embodiment, the circulator further includes a first ground plane between the first ferrite element and the first permanent magnet. According to yet another further embodiment, the circulator further includes a second ferrite element over and aligned along the axis with the resonator and the first ferrite element.

An embodiment of a wireless communication system includes a transmitter lineup and a circulator-coupler device. The transmitter lineup that includes a digital predistortion circuit and a first amplifier with a first amplifier output, and the first amplifier is configured to produce an RF transmit signal at the first amplifier output. The circulator-coupler device is coupled to the first amplifier output, and the circulator-coupler device includes a ferrite element, a resonator over and aligned along an axis with the ferrite element, and a plurality of resonator ports connected to the resonator. The plurality of resonator ports includes a first resonator port and a second resonator port, a first portion of a perimeter of the resonator extends between the first and second resonator ports, and the first resonator port is coupled to the first amplifier output. The circulator-coupler device also includes a permanent magnet aligned along the axis with the ferrite element. The permanent magnet biases the ferrite element and causes a signal conducted through the resonator to have a directionality along a rotational direction that extends from the first resonator port to the second resonator port. In addition, the circulator-coupler device also includes a first coupler element positioned across a gap from the portion of the perimeter of the resonator that extends between the first and second resonator ports, a first coupler port connected to a first end of the first coupler element that is physically closer to the second resonator port, and a second coupler port connected to a second end of the first coupler element that is physically closer to the first resonator port. The first coupler port is coupled to the digital predistortion circuit, and the second coupler port is terminated to ground.

An embodiment of a method of fabricating a circulator includes coupling a permanent magnet, a ferrite element, and a resonator together along an axis, where a plurality of resonator ports are connected to the resonator, and the plurality of resonator ports includes a first resonator port and a second resonator port. A first portion of a perimeter of the resonator extends between the first and second resonator ports, and the permanent magnet biases the ferrite element and causes a signal conducted through the resonator to have a directionality along a rotational direction that extends from the first resonator port to the second resonator port. The method also includes securing a first coupler element across a gap between the portion of the perimeter of the resonator that extends between the first and second resonator ports. First and second coupler ports are connected to first and second ends, respectively, of the first coupler element, and the first coupler element and the resonator are arranged to have a coupling factor between them in a range of 10 dB to 60 dB.

According to a further embodiment, the plurality of resonator ports includes a third resonator port connected to the resonator, and the method further includes securing a second coupler element across a gap between a portion of the perimeter of the resonator that extends between the second and third resonator ports, and securing a third coupler element across a gap between a portion of the perimeter of the resonator that extends between the third and first resonator ports. According to another further embodiment, securing the first coupler element comprises coupling the first coupler element to a dielectric substrate.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A circulator comprising:
   a first ferrite element;
   a resonator over and aligned along an axis with the first ferrite element;
   a plurality of resonator ports connected to the resonator, wherein the plurality of resonator ports includes a first resonator port and a second resonator port, and wherein a first portion of a perimeter of the resonator extends between the first and second resonator ports;
   a first coupler element positioned across a first gap from the first portion of the perimeter of the resonator; and
   a first coupler port connected to the first coupler element.

2. The circulator of claim 1, wherein the first coupler element and the resonator are arranged to have a coupling factor between them in a range of 10 decibels (dB) to 60 dB.

3. The circulator of claim 1, further comprising:
   a first dielectric substrate, wherein the first coupler element is coupled to the first dielectric substrate.

4. The circulator of claim 3, wherein a portion of the first dielectric substrate is present between the first ferrite element and the resonator.

5. The circulator of claim 4, wherein the resonator and the first coupler element are formed on the first dielectric substrate.

6. The circulator of claim 1, wherein the resonator is in direct contact with the first ferrite element.

7. The circulator of claim 1, wherein an air gap is present between the first ferrite element and the resonator.

8. The circulator of claim 1, wherein:
   the perimeter of the resonator is circular, and
   the first and second resonator ports are separated by 120 degrees around the perimeter of the resonator.

9. The circulator of claim 1, wherein the plurality of resonator ports further includes a third resonator port.

10. The circulator of claim 9, further comprising:
    a second coupler element positioned across a second gap from a portion of the perimeter of the resonator that extends between the second and third resonator ports; and
    a third coupler element positioned across a third gap from a portion of the perimeter of the resonator that extends between the third and first resonator ports.

11. The circulator of claim 1, further comprising:
    a first permanent magnet aligned along the axis with the first ferrite element, wherein the first permanent magnet biases the first ferrite element and causes a signal conducted through the resonator to have a directionality along a rotational direction that extends from the first resonator port to the second resonator port.

12. The circulator of claim 11, wherein the first coupler port is connected to a first end of the first coupler element, and the circulator further comprises:
    a second coupler port connected to a second end of the first coupler element.

13. The circulator of claim 12, wherein the first coupler port is physically closer to the second resonator port, and the second coupler port is physically closer to the first resonator port.

14. The circulator of claim 13, further comprising:
    a resistor with a first terminal electrically coupled to the second coupler port, and a second terminal coupled to ground.

15. The circulator of claim 11, further comprising:
a first ground plane between the first ferrite element and the first permanent magnet.

16. The circulator of claim 1, further comprising:
a second ferrite element over and aligned along the axis with the resonator and the first ferrite element.

17. A communication system comprising:
a transmitter lineup that includes a digital predistortion circuit and a first amplifier with a first amplifier output, wherein the first amplifier is configured to produce a radio frequency (RF) transmit signal at the first amplifier output; and
a circulator-coupler device coupled to the first amplifier output, wherein the circulator-coupler device includes
a ferrite element,
a resonator over and aligned along an axis with the ferrite element,
a plurality of resonator ports connected to the resonator, wherein the plurality of resonator ports includes a first resonator port and a second resonator port, and wherein a first portion of a perimeter of the resonator extends between the first and second resonator ports, and wherein the first resonator port is coupled to the first amplifier output,
a permanent magnet aligned along the axis with the ferrite element, wherein the permanent magnet biases the ferrite element and causes a signal conducted through the resonator to have a directionality along a rotational direction that extends from the first resonator port to the second resonator port,
a first coupler element positioned across a gap from the portion of the perimeter of the resonator that extends between the first and second resonator ports,
a first coupler port connected to a first end of the first coupler element that is physically closer to the second resonator port, wherein the first coupler port is coupled to the digital predistortion circuit, and
a second coupler port connected to a second end of the first coupler element that is physically closer to the first resonator port, wherein the second coupler port is terminated to ground.

18. The communication system of claim 17, further comprising:
an antenna connector coupled to the second resonator port; and
a receiver lineup that includes a second amplifier with a second amplifier input, and
wherein the plurality of resonator ports connected to the resonator further include a third resonator port, and wherein the third resonator port is coupled to the second amplifier input.

19. The communication system of claim 17, wherein the first amplifier is a Doherty amplifier.

20. A method of fabricating a circulator comprising:
coupling a permanent magnet, a ferrite element, and a resonator together along an axis, wherein a plurality of resonator ports are connected to the resonator, and the plurality of resonator ports includes a first resonator port and a second resonator port, wherein a first portion of a perimeter of the resonator extends between the first and second resonator ports, and wherein the permanent magnet biases the ferrite element and causes a signal conducted through the resonator to have a directionality along a rotational direction that extends from the first resonator port to the second resonator port; and
securing a first coupler element across a gap between the portion of the perimeter of the resonator that extends between the first and second resonator ports, wherein first and second coupler ports are connected to first and second ends, respectively, of the first coupler element, and wherein the first coupler element and the resonator are arranged to have a coupling factor between them in a range of 10 decibels (dB) to 60 dB.

21. The method of claim 20, wherein the plurality of resonator ports includes a third resonator port connected to the resonator, and the method further comprises:
securing a second coupler element across a gap between a portion of the perimeter of the resonator that extends between the second and third resonator ports; and
securing a third coupler element across a gap between a portion of the perimeter of the resonator that extends between the third and first resonator ports.

22. The method of claim 20, wherein securing the first coupler element comprises coupling the first coupler element to a dielectric substrate.

* * * * *